United States Patent [19]
Dutta et al.

[11] Patent Number: 5,374,831
[45] Date of Patent: Dec. 20, 1994

[54] QUANTUM WELL PHONON MODULATOR

[75] Inventors: Mitra Dutta, Matawan, N.J.; Gerald J. Iafrate, Raleigh, N.C.; Ki W. Kim; Michael A. Stroscio, both of Durham, N.C.

[73] Assignee: The United States of America as represented by the Secretary of the Army, Washington, D.C.

[21] Appl. No.: 51,105

[22] Filed: Apr. 14, 1993

[51] Int. Cl.$^5$ ............................................. H01L 29/225
[52] U.S. Cl. ........................................ 257/23; 257/14; 257/12; 257/9
[58] Field of Search .................. 257/12, 14, 15, 17, 257/18, 23, 9

[56] References Cited

U.S. PATENT DOCUMENTS

| | | | |
|---|---|---|---|
| 4,720,309 | 1/1988 | Deveaud et al. | 257/15 |
| 4,816,878 | 3/1989 | Kano et al. | 257/17 |

OTHER PUBLICATIONS

Mitra Dutta, "Optical Modulator Based On Γ–X Valley Mixing in GaAs–AlAs", Ser. No. 07/765,215, filed Sep. 20, 1991.
D. A. B. Miller, "Optoelectronic Applications of Quantum Wells," Optics Photonics, vol. 1, No. 2, p. 7, Feb. 1990.
R. Fuchs et al., "Optical Modes of Vibration in an Ionic Crystal Slab," Phys. Rev. 140, A2076 (1965).
K. Mori et al., "Electron–optical–phonon Interaction in Single and Double Heterostructures," Phys. Rev. B40, 6175 (1989).
G. Fasol et al., "Interface Roughness and the Dispersion of Confined LO Phonons in GaAs/AlAs Quantum Wells", Phys. Rev. B38, 6056 (1988).
L. P. Fu et al., "Ramon Study of Interface Phonons on GaAs/AlAs quantum wells," Phys. Rev. B46, 796 (1992).
James H. Licari et al., "Electron Phonon Interaction in a Dielectric Slab: Effect of the Electronic Polarizability," Phys. Rev. 15, 2254 (1977).
Michael A. Stroscio et al., Appl. Phys. Lett., 59, 1093 (1991) "Transition from Longitudinal-Optical Phonon Scattering to Surface-Optical Phonon Scattering in Polar Semiconductor Superlattices,".
K. W. Kim et al., "Electron Optical Phonon Scattering Rates in a Rectangular Semiconductor Quantum Wire," J. Appl. Phys., 70, 319 (1991)
D. S. Kim et al., "Confined-to-propagating Transition of LO Phonons in GaAs/Al$_x$Ga$_{1-x}$As Superlattices Observed by Picosecond Ramon Scattering," Phys. Rev. Lett., 68, 1002 (1992).
N. Mori et al., "Effects of Electron–interface–phonon Interaction on Resonant Tunnelling in Double Barrier Heterostructures," Semicond. Sci Technol., 7, B83 (1992).
P. G. Klemens, "An harmonic Decay of Optical Phonons," Phys. Rev. 148, 845 (1966).

*Primary Examiner*—Jerome Jackson
*Assistant Examiner*—John F. Guay
*Attorney, Agent, or Firm*—Michael Zelenka; William H. Anderson

[57] ABSTRACT

A phonon modulator which includes a semiconductor body having at least first and second polar semiconductor quantum wells formed therein separated by a polar semiconductor barrier. The conduction band energies of the wells and barrier are selected such that the lowest energy electronic states in the two wells are separated by an energy which is greater than the energies of optical phonons in the well and barrier materials. Respective voltages are applied to the wells which are less than the optical phonon emission threshold in the well and barrier materials to generate respective currents therein. Increasing the voltage to the first well to a level in excess of such optical phonon emission threshold causes optical phonons to be emitted from the first well to create a standing interface mode from the first well through the barrier to the second well, thereby providing a scattering mechanism for electrons in the second well and reducing the current thereof.

6 Claims, 1 Drawing Sheet

QUANTUM WELL PHONON MODULATOR

GOVERNMENT INTEREST

The invention described herein may be manufactured, used and licensed by or for the Government of the United States of America without the payment to us of any royalty thereon.

FIELD OF THE INVENTION

The present invention relates to quantum well modulators and, more particularly, to multiple quantum well phonon modulators.

BACKGROUND OF THE INVENTION

Multiple quantum wells are semiconductor structures comprised of alternating thin layers of two different semiconductor materials and, in particular, of semiconductor materials having differing bandgaps. Typically, layer thicknesses are of the order of 100 Å and a typical structure might comprise 100 such layers, resulting in a total thickness of about 1 micrometer. Multiple quantum well structures are typically produced using molecular beam epitaxy or metal-organic chemical vapor deposition sometimes known as organometallic vapor phase epitaxy. Multiple quantum well structures have been used successfully in many different optical devices, such as optical modulators.

An example of a multiple quantum well structure may be found in the co-pending application of Mitra Dutta entitled "Optical Modulator Based On Γ-X Valley Mixing in GaAs-AlAs", Ser. No. 07/765,215, filed Sep. 20, 1991. An example of an optical modulator employing the multiple quantum well structure of the foregoing application may be found in the co-pending application of Mitra Dutta and Hongen Shen entitled "All Optical Multiple Quantum Well Optical Modulator," filed concurrently herewith. Other examples of both electrically controlled and optically controlled multiple quantum well devices can be found in an article by D. A. B. Miller, "Optoelectronic Applications of Quantum Wells,"Optics Photonics, Vol. 1, No. 2, page 7, February 1990.

Although optical multiple quantum well modulators have a number of advantages, the present invention is based on the recognition that significant other advantages can be achieved by multiple quantum well modulators based on phonon stimulation and emission, rather than photon stimulation and emission.

The existence of interface longitudinal-optical (LO) phonons in quantum wells is well known. See, for example, R. Fuchs et al, Phys. Rev. 140, A2076 (1965); K. Mori et al, Phys. Rev. B40, 6175 (1989); G. Fasol et al, Phys. Rev. B38, 6056 (1988); L. P. Fu et al, Phys. Rev. B. 46, 796 (1992).

In addition to interface LO phonons, quantum wells also contain sinusoidal or confined phonons. The general characteristics of both confined and interface LO phonons in quantum wells are described in "Electron Phonon Interaction in a Dielectric Slab: Effect of the Electronic Polarizability," James H. Licari et al, Phys. Rev. 15, 2254 (1977). Further background on interface LO phonons and confined LO phonons in semiconductors may be found in the following: Michael A. Stroscio et al, Appl. Phys. Lett., 59, 1093 (1991); K. W. Kim et al, J. Appl. Phys., 70, 319 (1991); D. S. Kim et al, Phys. Rev. Lett., 68, 1002 (1992); N. Mori et al, Semicond. Sci Technol., 7, B83 (1992); and P. G. Klemens, Phys. Rev. 148,845 (1966).

SUMMARY OF THE INVENTION

The object of the present invention is to provide a quantum well current modulator based on phonon stimulation and emission.

The foregoing and other objects are achieved in accordance with the present invention by a phonon modulator which includes a semiconductor body having at least first and second quantum wells formed therein separated by a polar semiconductor barrier. The conduction band energies of the wells and barrier are such that the lowest energy electronic states in the two wells are separated by an energy which is greater than the energies of optical phonons in the well and barrier materials. Means are provided for applying respective voltages to the wells which are less than the optical phonon energies in the well and barrier material to generate respective currents in the wells. Modulation is effected by increasing the voltage to the first well to a level in excess of the optical phonon energies so that optical phonons are emitted in the first well to create a standing interface mode extending from the first well through the barrier to the second well, thereby providing a scattering mechanism for electrons in the second well and reducing the current thereof.

The response times for the onset and reduction of scattering of the current in the second well is controlled by the basic limits set by the phonon propagation time from the region of the first well to the region of the second well and by the phonon lifetime, respectively. This results in the rise and fall times of the modulated current also being set by the phonon lifetime and propagation times. One of the advantages of the present invention is that these properties are not greatly affected by temperature. As a result, the rise and fall times of the modulated current vary insignificantly over a wide range of temperatures.

Other features and advantages of the present invention will be more fully understood when considered in conjunction with the accompanying drawings.

DETAILED DESCRIPTION OF THE INVENTION

Figure 1:
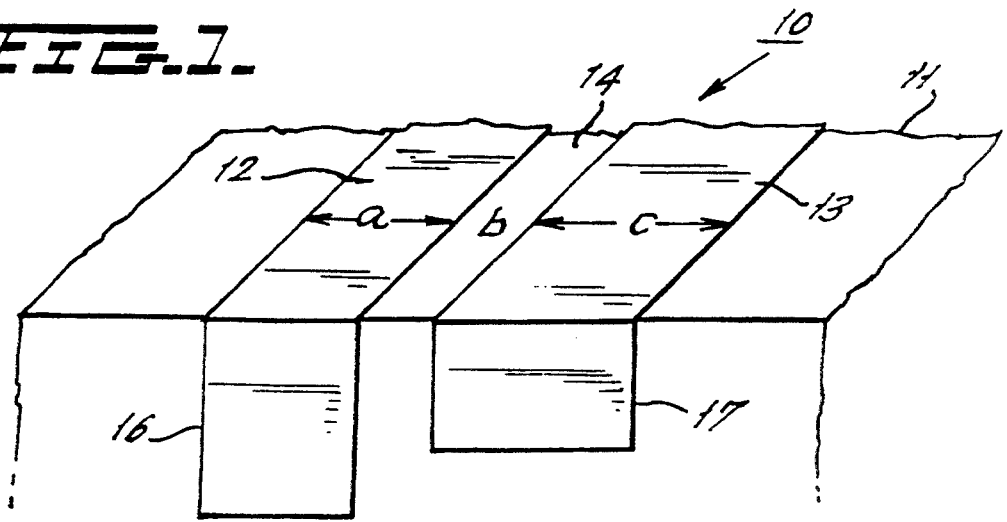
FIG. 1 is a diagrammatic cross-sectional view of a quantum well modulator in accordance with the present invention.

Referring now to the drawings and, in particular to FIG. 1, there is shown a phonon modulated switch or modulator 10 in accordance with the present invention. The modulator 10 is comprised of a semiconductor body 11 having formed therein first and second polar semiconductor quantum wells 12 and 13 separated by a thin polar semiconductor layer or barrier 14. The wells 12 and 13 include respective contacts 16 and 17 through which respective voltages $V_1$ and $V_2$ may be applied. The well 12 has a thickness of a, the barrier has a thickness of b, and the well 13 has a thickness of c. The thicknesses a, b and c may typically be of the order of 50 Å or less. Advantageously, the body 11 is formed from a material such as aluminum arsenide (AlAs), and the quantum wells 12 and 13 are each formed from a semiconductor material such as gallium arsenide (GaAs) which has a conduction band lower than the material used for the quantum barriers.

Figure 2:
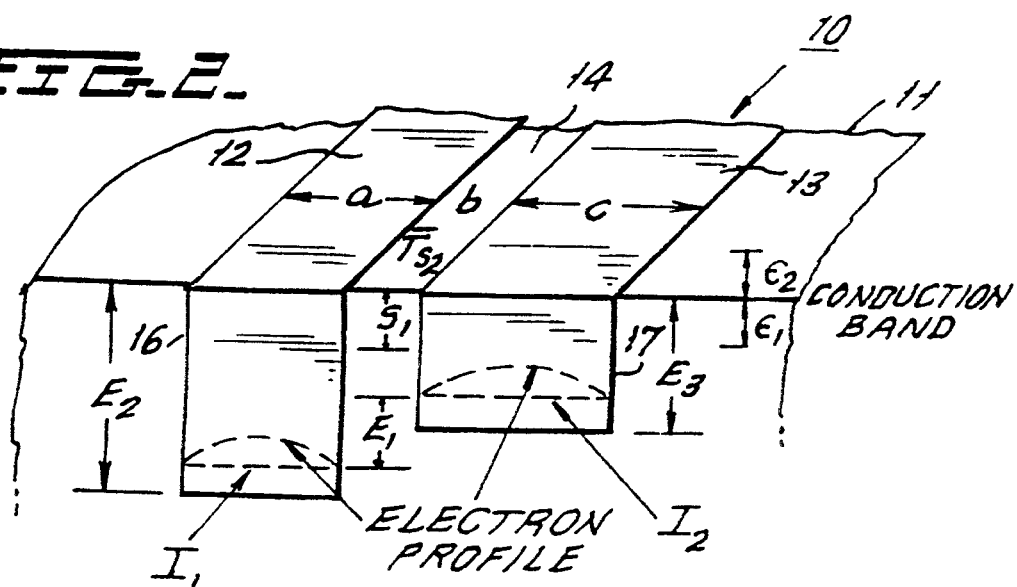
FIG. 2 is a schematic band gap diagram of the multiple quantum well modulator of FIG. 1 in which there is no coupling between wells.

More specifically, referring to FIG. 2, the wells 12 and 13 are constructed so as to have conduction band energies in which the lowest energy electronic states in the two wells are separated by an energy $E_1$ which is greater than the energies of optical phonons in the wells 12 and 13 and the barrier 14. To establish optimum operating parameters for current modulation, the nominal conduction band energies may be offset by energies covering the ranges $S_1$, $S_2$, $\epsilon_1$, and $\epsilon_2$ as illustrated in FIG. 2. The barrier width, b, is chosen so as to be sufficiently narrow to allow a sufficient propagation of interface phonon modes between the wells 12 and 13, but not so narrow as to allow excessive charge tunnelling between the wells.

Figure 3:
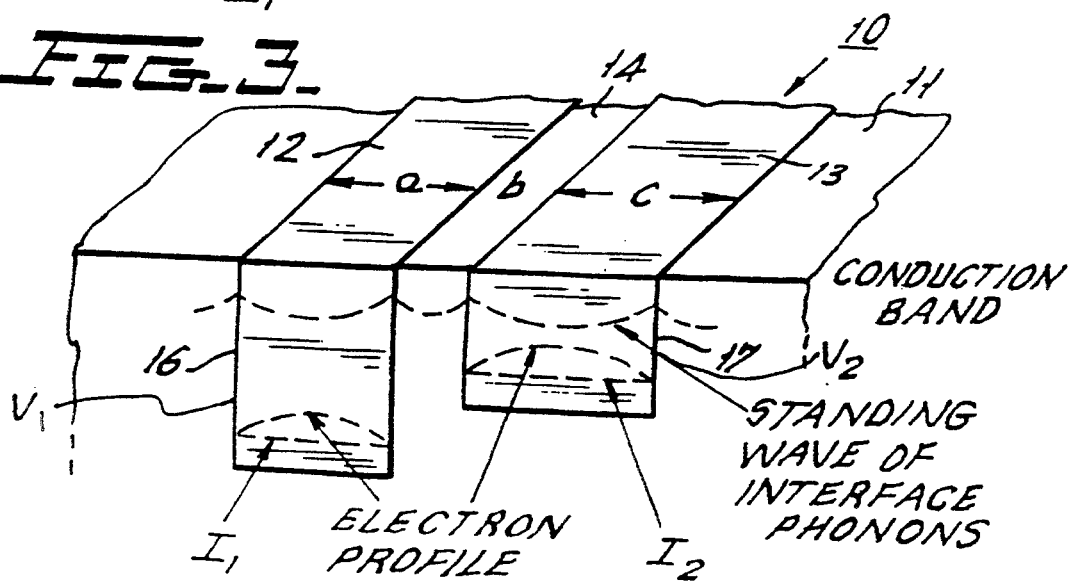
FIG. 3 is a schematic diagram of the modulator of FIG. 1 showing coupling between the wells.

In operation, voltages $V_1$ and $V_2$, which have magnitudes less than the optical phonon energies in the wells 12 and 13 and the barrier 14, are applied to the wells 12 and 13 through their respective contacts 16 and 17 resulting in respective currents $I_1$ and $I_2$ through the wells. Since the voltages $V_1$ and $V_2$ are less than the optical phonon energies in the wells 12 and 13 and the barrier 14, phonons will not be emitted and the currents $I_1$ and $I_2$ will be independent of one another. However, as seen in FIG. 3, when the voltage $V_1$ is increased to levels in excess of the optical phonon energies in the wells 12 and 13 and the barrier 14, optical phonons are emitted by the electrons in current $I_1$, thereby creating a standing interface phonon mode extending through the well 12, the barrier 14 and the well 13. The interface phonons produced by the electrons in the current $I_1$ provide a scattering mechanism for the electrons in the current $I_2$. As a result, the current $I_2$ is reduced. In other words, switching of the voltage $V_1$ between a level below the optical phonon emission threshold and above that level results in a switching or modulation of the current $I_2$. It should be noted that the maximum level of the voltage $V_1$ should not exceed $E_1$ so as to avoid loss of current $I_1$ due to resonant tunnelling.

The response times for the onset of scattering in current $I_2$ is controlled by the phonon propagation time from the well 12 to the well 13 and the response time for the reduction of scattering is controlled by the phonon lifetime. Thus, the rise and fall times in the modulations of the current $I_2$ are reliably set by phonon properties. Since these properties are not greatly affected by changes in temperature, the modulator provides consistent modulation over a wide range of temperatures.

Although the present invention has been described in relation to a particular embodiment thereof, many other variations and modification and other uses will become apparent to those skilled in the art. It is preferred therefore that the present invention be limited not by the specific disclosure herein but only by the appended claims.

What is claimed is:

1. A semiconductor heterostructure for use in a phonon modulator comprising:
   at least first and second polar semiconductor quantum wells, each of the quantum wells being formed of a selected polar semiconductor material and having predetermined dimensions; and
   at least one polar semiconductor barrier separating said first and second polar semiconductor quantum wells, the polar semiconductor barrier being formed of a selected polar semiconductor material and having predetermined dimensions such that an effective barrier width of the barrier is sufficiently narrow to allow propagation of interface optical phonon modes between the first and second wells, but not so narrow as to allow charge tunneling between the first and second wells;
   wherein the polar semiconductor materials and dimensions of the quantum wells and barrier are selected such that the lowest energy electronic states in the first and second quantum wells are separated by an energy gap which is greater than the energies of optical phonons in the quantum wells and barrier.

2. A semiconductor body in accordance with claim 1, wherein each quantum well is a multiple quantum well.

3. A phonon modulator comprising
   a semiconductor body having a multiple quantum well structure will at least first and second quantum wells formed therein separated by a polar semiconductor barrier, the wells and barrier having conductive band energies such that the lowest energy states in the first and second wells are separated by an energy gap which is greater than the energy of optical phonons in the well and barrier materials and such that an effective barrier width of the barrier is sufficiently narrow to allow propagation of interface optical phonon modes between the first and second wells, but not so narrow as to allow charge tunneling between the first and second wells; and
   means for applying respective voltages to the wells which are less than the optical phonon emission threshold in the well and barrier materials to generate respective currents in the wells and for increasing the voltage to the first well to a level in excess of such optical phonon energy levels so that optical phonons are emitted from the first well to create a standing interface mode from the first well through the barrier to the second well, thereby providing a scattering mechanism for electrons in the second well and reducing the current thereof.

4. A phonon modulator in accordance with claim 3 further comprising a plurality of multiple quantum well structures.

5. A phonon modulator in accordance with claim 4, wherein the applying means includes respective contacts on the first and second wells.

6. A method of operating a phonon modulator which includes a semiconductor body having at least first and second quantum wells formed therein separated by a polar semiconductor barrier, the conductive band energies of the wells and barrier body being such that the lowest energy electronic states in the first and second wells are separated by an energy gap which is greater than the energy levels of optical phonons in the well and barrier materials, the method comprising applying respective voltages to the wells which are less than the optical phonon energy levels in the well and barrier materials to generate respective currents in the wells; and increasing the voltage to the first well to a level in excess of such optical phonon energies so that optical phonons are emitted in the first well to create a standing interface made from the first well through the barrier to the second well, thereby providing a scattering mechanism for electrons in the second well and reducing the current thereof.

* * * * *